United States Patent
Bonaccio et al.

(10) Patent No.: US 7,268,632 B2
(45) Date of Patent: Sep. 11, 2007

(54) STRUCTURE AND METHOD FOR PROVIDING GATE LEAKAGE ISOLATION LOCALLY WITHIN ANALOG CIRCUITS

(75) Inventors: Anthony R. Bonaccio, Shelburne, VT (US); Hayden C. Cranford, Jr., Cary, NC (US); Joseph A. Iadanza, Hinesburg, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 11/163,013

(22) Filed: Sep. 30, 2005

(65) Prior Publication Data

US 2007/0075789 A1    Apr. 5, 2007

(51) Int. Cl.
H03L 7/00 (2006.01)
H03L 7/099 (2006.01)
H03B 5/18 (2006.01)

(52) U.S. Cl. .................... 331/17; 331/16; 331/25; 331/36 C; 331/1 A; 331/177 V; 327/157

(58) Field of Classification Search ........... 331/14, 331/16, 17, 18, 1 A, 25, 34, 36 C, 177 V; 327/156, 157
See application file for complete search history.

(56) References Cited

U.S. PATENT DOCUMENTS

| 5,361,231 A | * | 11/1994 | Hayano .................... 365/200 |
| 5,446,420 A | * | 8/1995 | Westwick ................. 331/179 |
| 5,677,884 A | * | 10/1997 | Zagar et al. .............. 365/200 |
| 5,903,197 A | * | 5/1999 | Kikugawa ................. 331/17 |
| 6,414,559 B1 | * | 7/2002 | Cole et al. ................ 331/158 |
| 6,680,520 B2 | | 1/2004 | Voldman et al. |
| 6,791,421 B2 | | 9/2004 | Oita |
| 2004/0115875 A1 | | 6/2004 | Voldman et al. |

FOREIGN PATENT DOCUMENTS

JP    2004159222 A    6/2004

* cited by examiner

*Primary Examiner*—Robert Pascal
*Assistant Examiner*—Ryan J Johnson
(74) *Attorney, Agent, or Firm*—Michael J. LeStrange; Hoffman, Warnick & D'Alessandro, LLC

(57) ABSTRACT

A loop filter for a phase-locked-loop is provided, comprising a set of capacitor banks coupled in parallel to form the loop filter, and a detection circuit for identifying and isolating defective capacitor banks. A method for providing a loop filter for a phase-locked-loop in accordance with an embodiment of the present invention includes the steps of forming the loop filter using a set of capacitor banks coupled in parallel, detecting any defective capacitor banks in the set of capacitor banks, isolating each defective capacitor bank, providing a set of redundant capacitor banks, and replacing each defective capacitor bank with a redundant capacitor bank from the set of redundant capacitor banks.

15 Claims, 8 Drawing Sheets

STRUCTURE AND METHOD FOR PROVIDING GATE LEAKAGE ISOLATION LOCALLY WITHIN ANALOG CIRCUITS

BACKGROUND OF THE INVENTION

1. Field of the Invention

The present invention generally relates to integrated circuits. More particularly, the present invention provides a structure and method for providing gate leakage isolation locally within analog circuits.

2. Related Art

With succeeding generations of semiconductor manufacturing technology, gate insulator (e.g., oxide) thicknesses have decreased dramatically, in part to support high performance, low power digital systems. Unfortunately, as gate oxide thicknesses decrease, local defects in the gate oxide become a larger factor in gate leakage within a semiconductor device. While gate leakage may be viewed as an unavoidable nuisance in digital systems, it may create functional and performance issues for analog circuits, such as Phase-Locked-Loops (PLLs), which are routinely integrated within a semiconductor device.

Figure 1:
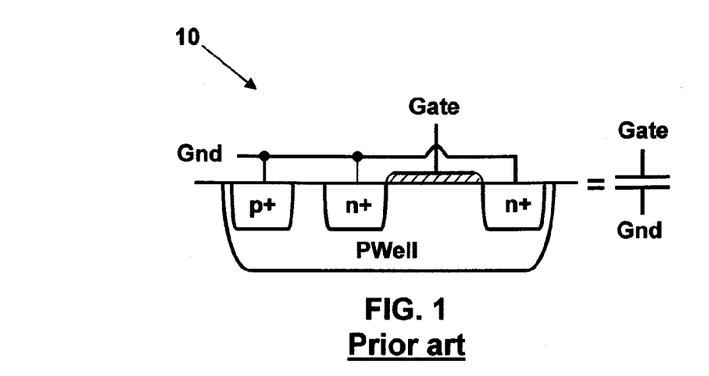
FIGS. 1 and 2 depict an illustrative thin-oxide capacitor.
Figure 2:
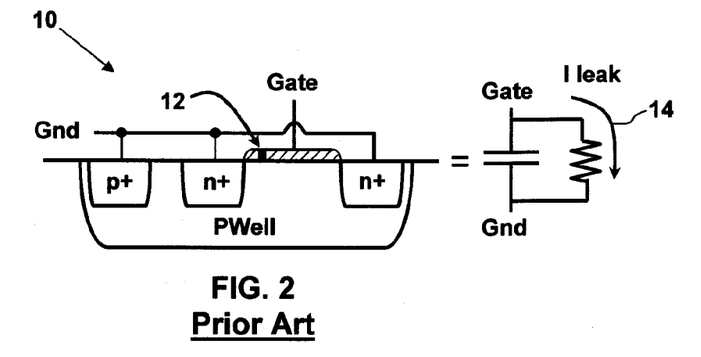
Figure 3:
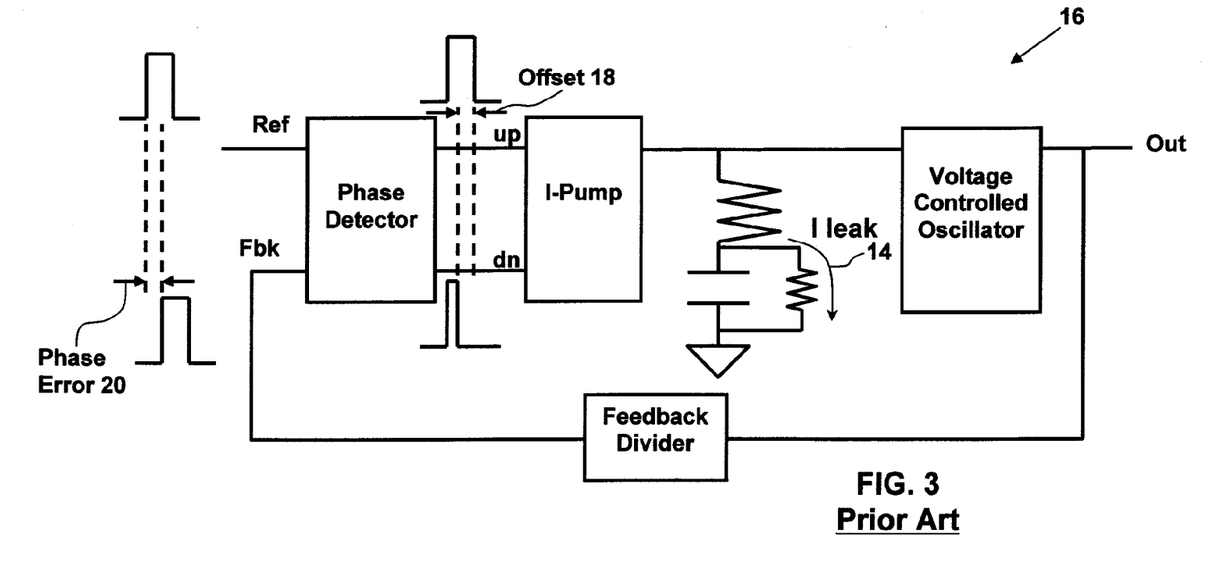
FIG. 3 depicts an illustrative PLL circuit.

The functional sensitivity of PLLs or similar circuits as a result of gate leakage is largely due to the use of thin-oxide capacitors in the construction of a PLL loop filter, which stores the control voltage critical to loop frequency stability. While oxide defect densities are typically reduced over time in a given technology, it has been estimated that in early production of new technologies, oxide defects, otherwise known as "pinholes," may affect a measurable percentage of unit capacitors within a PLL loop filter, resulting in an unacceptable reduction in manufacturing yield. An illustrative thin-oxide capacitor 10 is illustrated in FIG. 1 (no pinhole) and FIG. 2 (with pinhole 12 and resultant gate leakage current 14). As shown in the illustrative PLL circuit 16 depicted in FIG. 3, the gate leakage current 14 causes a current pump offset 18, which results in a phase error 20 between the reference signal (Ref) and feedback signal (Fbk) of the PLL circuit 16, thus negatively affecting the performance of the PLL circuit 16.

SUMMARY OF THE INVENTION

The present invention provides a structure and method for providing gate leakage isolation locally within analog circuits. In particular, the present invention provides for the detection and isolation of defective capacitors, and the redundant swapping of defective capacitors with non-defective capacitors, to negate the effect of oxide defects (e.g., pinholes) on analog circuit (e.g., PLL) performance and yield.

A first aspect of the present invention is directed to a circuit, comprising: a set of capacitor banks coupled in parallel to form a capacitor circuit; and a detection system for identifying and isolating defective capacitor banks in the capacitor circuit.

A second aspect of the present invention is directed to an integrated circuit, comprising a loop filter for a phase-locked-loop, wherein the loop filter includes a set of capacitor banks coupled in parallel to form the loop filter, and a detection system for identifying and isolating defective capacitor banks in the set of capacitor banks.

A third aspect of the present invention is directed to a method for providing a loop filter for a phase-locked-loop, comprising forming the loop filter using a set of capacitor banks coupled in parallel, detecting defective capacitor banks in the set of capacitor banks, isolating each defective capacitor bank, providing a set of redundant capacitor banks, and replacing each defective capacitor bank with a redundant capacitor bank from the set of redundant capacitor banks.

BRIEF DESCRIPTION OF THE DRAWINGS

These and other features of this invention will be more readily understood from the following detailed description of the various aspects of the invention taken in conjunction with the accompanying drawings in which.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present invention provides a structure and method for providing gate leakage isolation locally within analog circuits. In particular, the present invention provides for the detection and isolation of defective capacitors, and the redundant swapping of defective capacitors with non-defective capacitors, to negate the effect of oxide defects (e.g., pinholes) on analog circuit (e.g., PLL) performance and yield.

Figure 4:
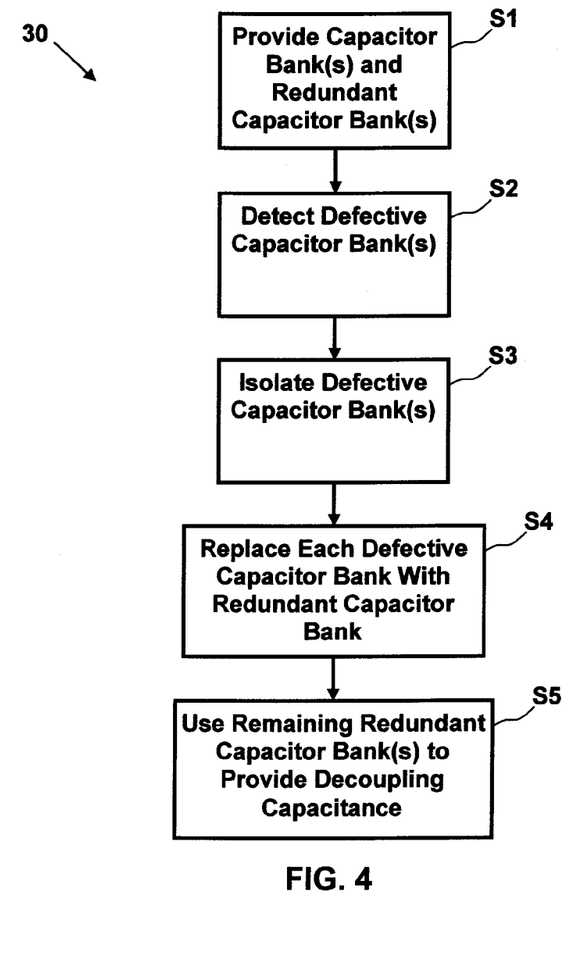
FIG. 4 depicts a flow diagram of a method in accordance with an embodiment of the present invention.
Figure 5:
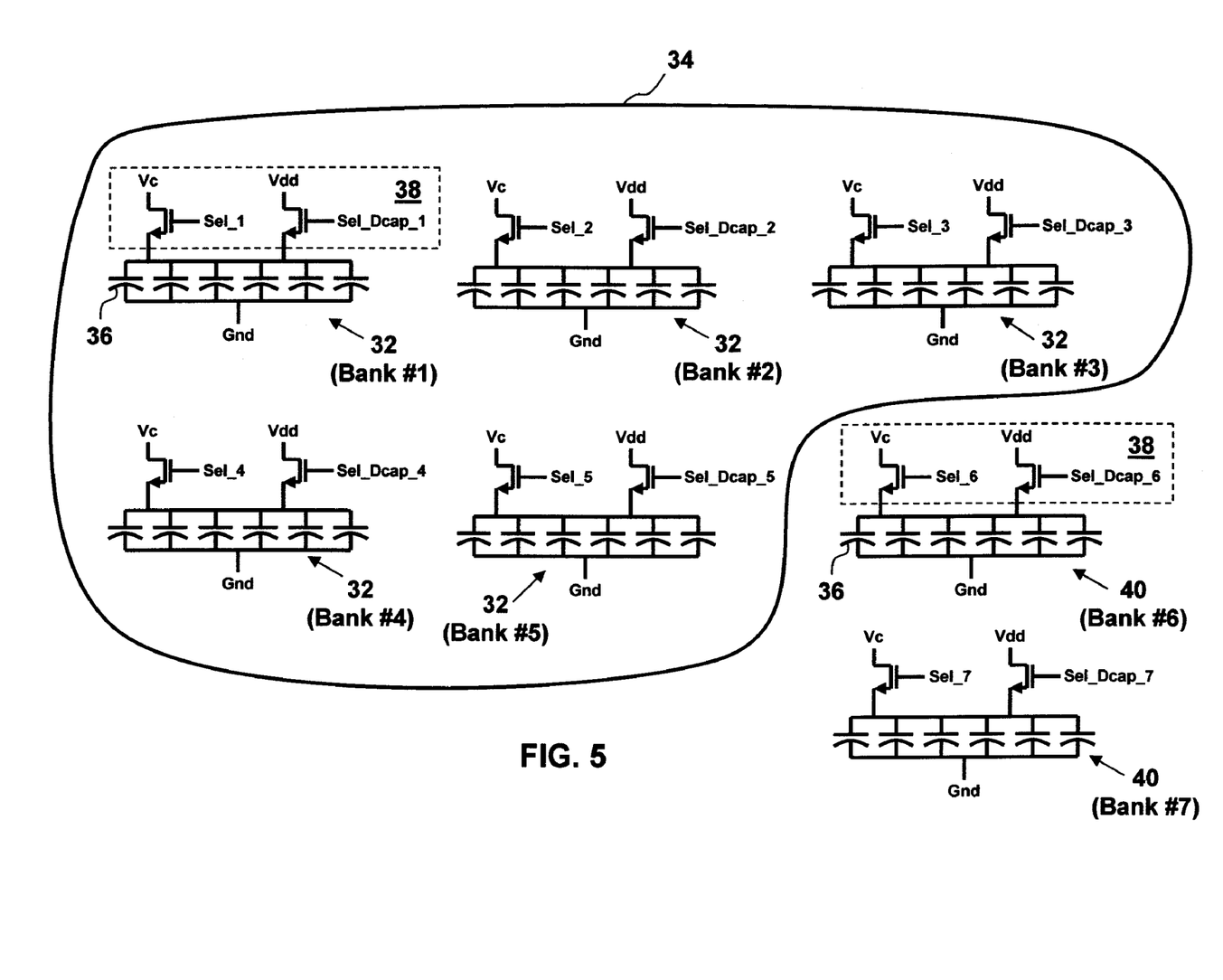
FIGS. 5-6 depict an illustrative PLL loop filter formed in accordance with the method of FIG. 4.

A flow diagram 30 of a method in accordance with an embodiment of the present invention is depicted in FIG. 4. In step S1, a set (i.e., one or more) of capacitor banks and a set (i.e., one or more) of redundant capacitor banks are provided. In FIG. 5, for example, a plurality of capacitor banks 32 (Bank #1-#5) are provided and combined in parallel to form an illustrative PLL loop filter 34, where each capacitor bank 32 includes at least one unit capacitor 36 to provide a desired capacitance. Each capacitor bank 32 further includes a switching system 38 for selectively and independently connecting the capacitor bank 32 to a charging voltage Vc, a supply voltage Vdd, or no voltage. A plurality of redundant capacitor banks 40 (Bank #6-#7) coupled in parallel are also provided. Each redundant capacitor bank 40 also includes at least one unit capacitor 36 to provide a desired capacitance and a switching system 38 for selectively and independently connecting the redundant capacitor bank 40 to a voltage Vc, a supply voltage Vdd, or no voltage. The specific number and structure of each capacitor bank 32 and redundant capacitor bank 40 will typically vary depending on application requirements and/or other criteria, and is not intended to be limited by the particular configuration illustrated in FIG. 5.

Referring again to FIG. 4, taken in conjunction with the components of the illustrative PLL loop filter 34 of FIG. 5, the capacitor banks 32 are tested in step S2 to detect "defective" capacitor banks 32 having an unacceptable level of gate leakage (e.g., due to pinholes). In step S3, each defective capacitor bank 32 detected in step S2 is isolated from the remaining "non-defective" capacitor banks 32. In step S4, each defective capacitor bank 32 is replaced by a redundant capacitor bank 40 to maintain a target capacitance value of the PLL loop filter 34. In the case of a differential PLL loop filter, a capacitive balance between the positive and negative sides of the differential PLL loop filter is also maintained. In optional step S5, one or more unused redundant capacitor banks 40, if available, are used to provide decoupling capacitance.

Figure 6:
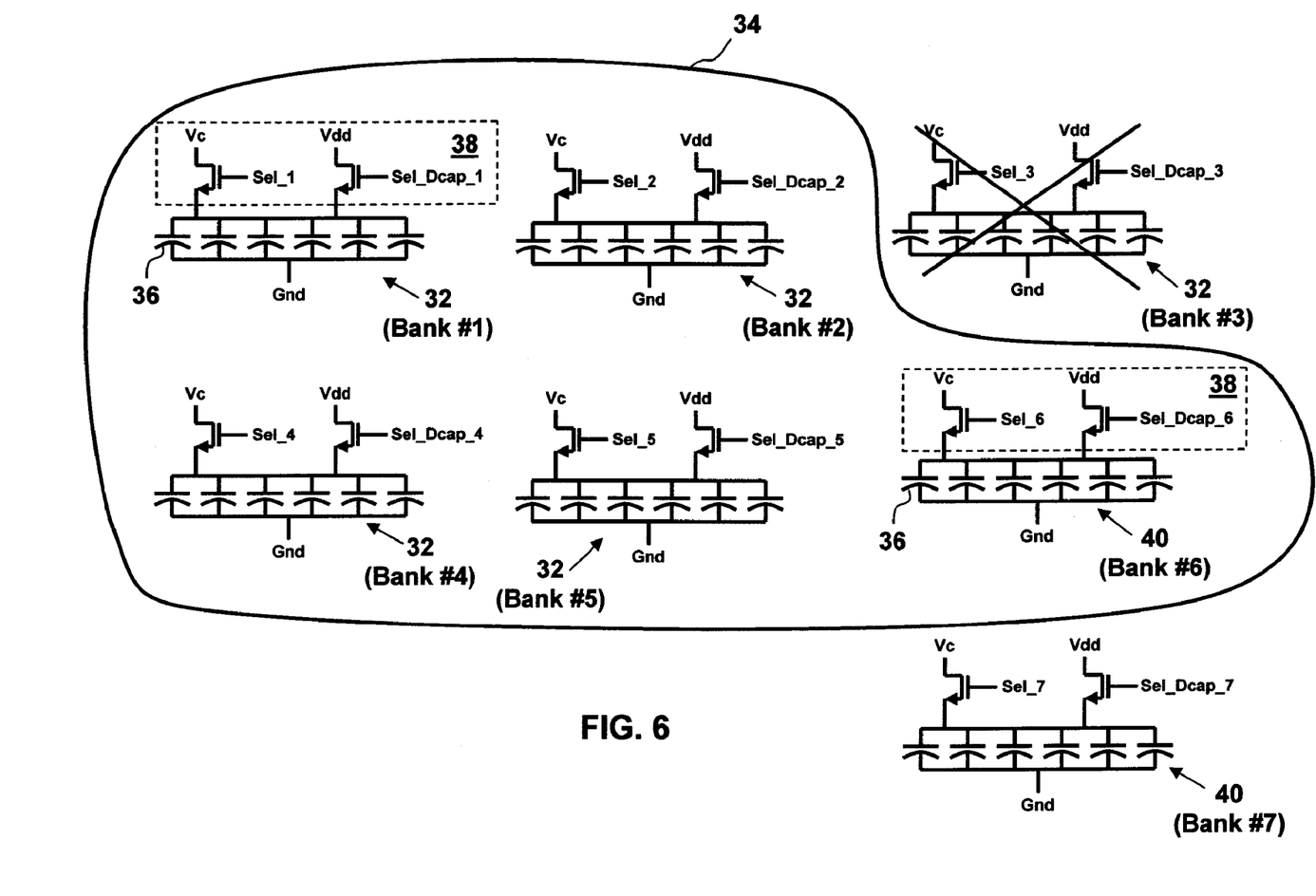

As an example of the above process, assume that the capacitor bank 32 (Bank #3) in the PLL loop filter 34 was found to be defective in step S2, isolated in step S3, and replaced by the redundant capacitor bank 40 (Bank #6) in step S4. To this extent, the PLL loop filter 34 would now appear as shown in FIG. 6. The unused redundant capacitor bank 40 (Bank #7) can be used to provide decoupling capacitance for the semiconductor device. This can be achieved, for example, by connecting the redundant capacitor bank 40 (Bank #7) between local voltage and ground planes in the semiconductor device.

Figure 7:
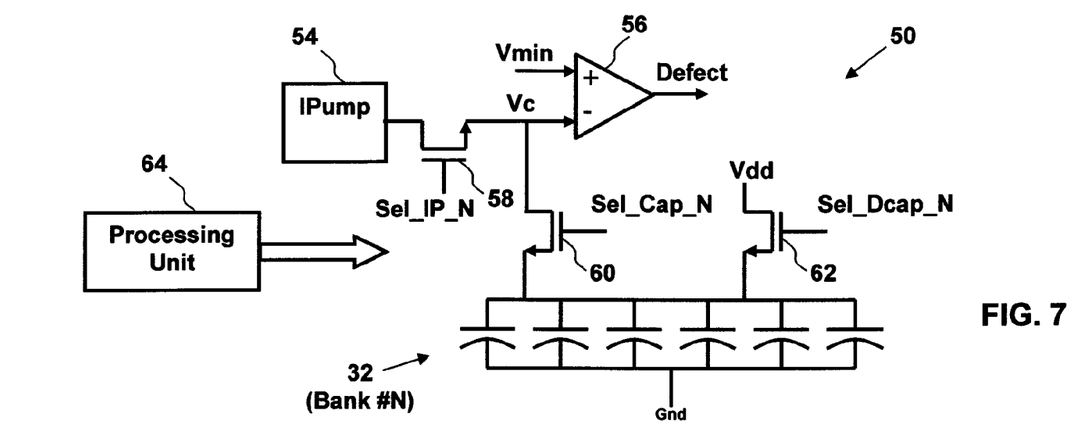
FIGS. 7 and 9 depict an illustrative system for detecting, isolating, and replacing a defective capacitor bank in accordance with an embodiment of the present invention.
Figure 8:
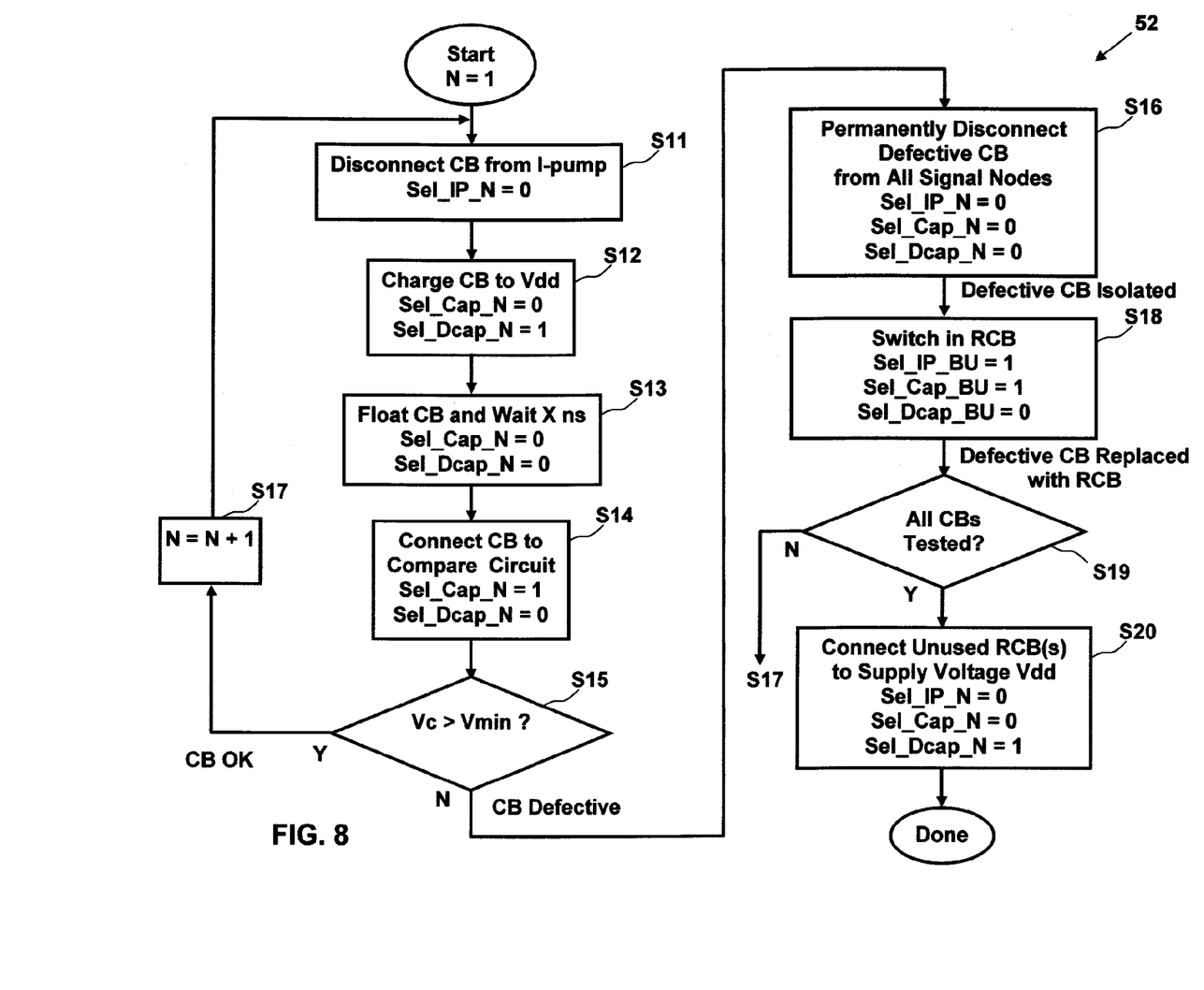
FIG. 8 depicts a flow diagram illustrating a process for detecting, isolating, and replacing a defective capacitor bank in accordance with an embodiment of the present invention.

An illustrative system 50 for detecting, isolating, and replacing a defective capacitor bank 32 in an integrated circuit in accordance with an embodiment of the present invention is illustrated in FIG. 7. A corresponding flow diagram 52 illustrating a process for detecting, isolating, and replacing a defective capacitor bank 32 in an integrated circuit in accordance with this embodiment of the present invention is illustrated in FIG. 8.

The system 50 includes a charge pump (IPump) 54, a compare circuit 56 for comparing the voltage Vc on each capacitor bank 32 to a predetermined minimum voltage Vmin, a switch 58 for selectively connecting the charge pump 54 to each capacitor bank 32, a switch 60 for selectively connecting each capacitor bank 32 to the compare circuit 56, and a switch 62 for selectively connecting each capacitor bank 32 to the supply voltage Vdd. In this example, the switches 58, 60, and 62 are implemented using NFETs. Other types of switches could also be used. The switching of the switches 58, 60, and 62 can be controlled by a processing unit 64 that is configured to control the detection, isolation, and replacement of defective capacitor banks 32 in order to configure the PLL loop filter 34 with the required capacitance.

In step S11 of the flow diagram 52, a capacitor bank 32 (Bank #N) to be tested for defects is disconnected from the charge pump 54 by setting Sel_IP_N=0 (0 refers to "logic 0" (e.g., Gnd)). In step S12, the capacitor bank 32 (Bank #N) is charged to Vdd by setting Sel_Cap_N=0 and Sel_Dcap_N=1 (1 refers to "logic 1" (e.g., Vdd)). In step S13, the capacitor bank 32 (Bank #N) is floated in isolation for a predetermined time (e.g., X ns) by setting Sel_Cap_N=0 and Sel_Dcap_N=0. During this time, the voltage on the capacitor bank 32 (Bank #N) decreases due to RC degradation. In step S14, the capacitor bank 32 (Bank #N) is connected to the compare circuit 56 by setting Sel_Cap_N=1 and Sel_Dcap_N =0. If, in step S15, the compare circuit 56 determines that the voltage Vc remaining on the capacitor bank 32 (Bank #N) is less than the predetermined minimum voltage Vmin, then the capacitor bank 32 (Bank #N) is considered to be defective and flow passes to step S16. However, if the voltage Vc remaining on the capacitor bank 32 (Bank #N) is determined to be greater than the predetermined minimum voltage Vmin, then the capacitor bank 32 (Bank #N) is considered to be non-defective. In this case, N is incremented in step S17 and flow passes back to step S11. The above-described defect detection process is then repeated for the next capacitor bank 32.

Figure 9:
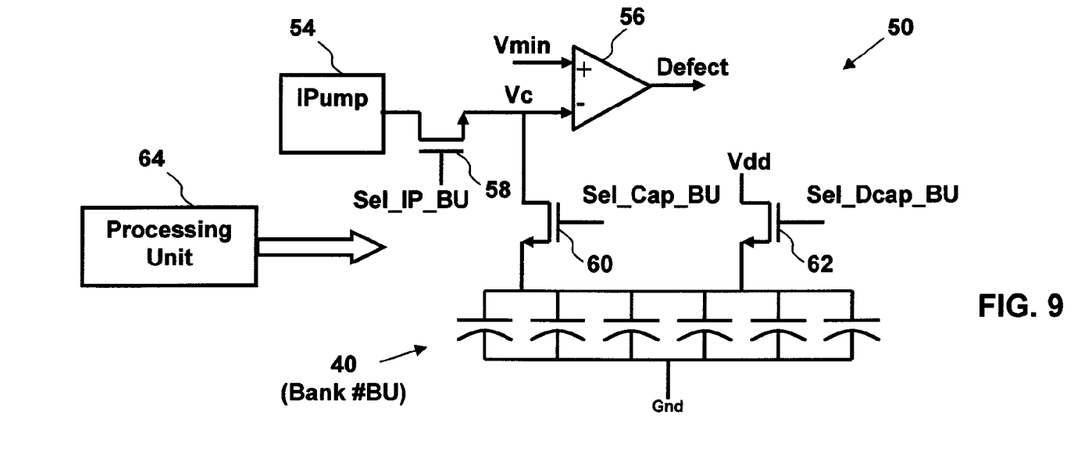

In step S16, the defective capacitor bank 32 (Bank #N) is permanently isolated from all signal nodes by setting Sel_IP_N=0, Sel_Cap_N=0, and Sel_Dcap_N=0. In step S18 (referring also to FIG. 9) the defective capacitor bank 32 (Bank #N) is replaced with an available redundant capacitor bank 40 (Bank #BU) by setting Sel_IP_BU=1, Sel_Cap_BU=1, and Sel_Dcap_BU=0. After all of the capacitor banks 32 have been tested (step S19), flow passes to optional step S20 (referring again to FIG. 9) where each unused redundant capacitor bank 40, if any, is connected to the supply voltage Vdd as a decoupling capacitance by setting Sel_IP_BU=0, Sel_Cap_BU=0, and Sel_Dcap_BU=1.

In accordance with another embodiment of the present invention, the testing of the capacitor banks 32 can be performed on power-up/reset/initialization of an integrated circuit to determine if the capacitor banks 32 meet the gate leakage requirement for the PLL loop filter 34. The capacitor banks 32 can be tested individually to screen for capacitor banks 32 with a higher than acceptable gate leakage, or in successive overlapping groups to search for an acceptable PLL loop filter topology. At the termination of power-up /reset/initialization, a set (i.e., one or more) of the non-defective capacitor banks 32 can be used to construct the PLL loop filter 34 for functional operation. The remaining capacitor banks 32, unused in the PLL loop filter 34, are either defective or unused non-defective spares. Spare capacitor banks 32 can be connected between local voltage and ground planes to improve capacitive decoupling. In the case of differential PLL loop filters, both parts of the PLL loop filter are handled similarly.

In accordance with a further embodiment of the present invention, a PLL loop filter 34 is constructed using a set (i.e., one or more) of capacitor banks 32. Should a capacitor bank 32 be found to produce an unacceptable gate leakage, it is disconnected from the PLL loop filter 34. The removal of the defective capacitor bank 32 reduces the capacitance provided for in the PLL loop filter 34 by 1/N, where N is the original number of capacitor banks 32 used in the PLL loop filter 34. For a differential PLL loop filter, the capacitance in both loops is reduced to achieve balance. Unused non-defective capacitor banks 32 can be used for decoupling capacitors as described above. In this embodiment, charge pump characteristics can be changed to account for any reduction in PLL loop filter 34 capacitance. The minimum amount of capacitance provided by the PLL loop filter 34 can be specified. If the minimum amount of capacitance can not be provided, the integrated circuit is considered non-fixable. The capacitor value limitation may be fixed, or contingent on process, wafer or chip level measurements.

In yet another embodiment of the present invention, a PLL loop filter 34 is constructed using one or more capacitor banks 32 from a General Purpose Capacitor Array (GPCA) on an integrated circuit. The power-up/reset/initialization function assigns a pre-determined set (i.e., one or more) of non-defective capacitor banks 32 in the GPCA to the PLL loop filter 34 to provide the required capacitance. A set (i.e., one or more) of the remaining non-defective capacitor banks 32 in the GPCA can be used for decoupling capacitance. Defective capacitor banks 32 in the GPCA can be connected to negate gate leakage current, as described above.

Each of these embodiments may be performed, for example, at manufacturing test time, with results burned into non-volatile memory elements such as electrically blowable fuses (E-fuses). Alternatively, each of these embodiments may be implemented in a manner which allows retesting and configuration upon each power-up of the device, or at other times as may be indicated by environmental or functional shifts. In most cases, gating of the various capacitor banks can be controlled by a processing unit. Control signals to each of the switches may be unique, or provided for using scan or other serial control chains.

Figure 10:
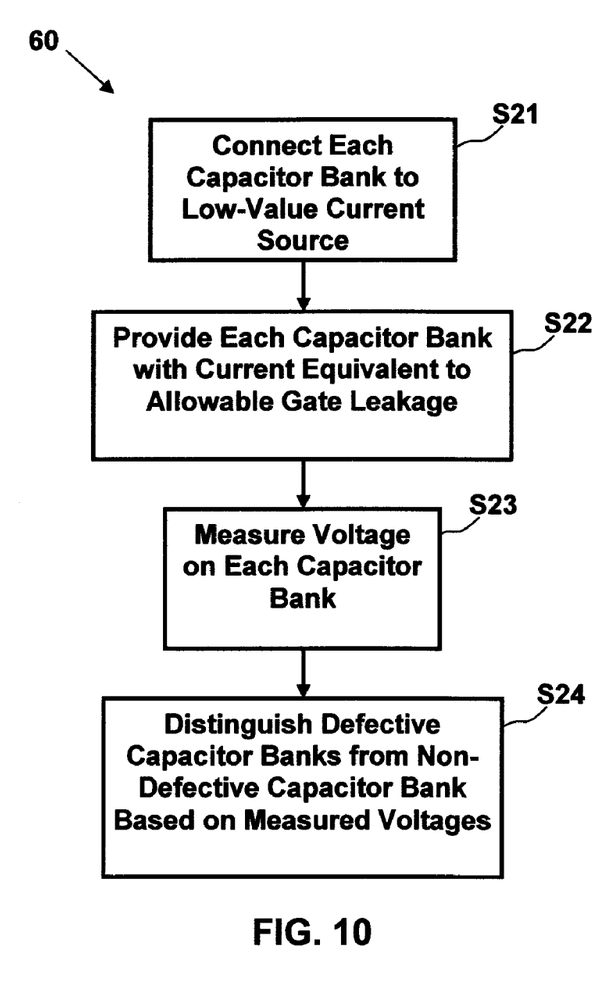
FIGS. 10-12 depict flow diagrams illustrating processes for detecting a defective capacitor bank in accordance with other embodiments of the present invention.

Numerous other defect detection techniques can also be used in the practice of the present invention. For example, FIG. 10 depicts a flow diagram 60 illustrating a process for detecting defective capacitor banks 32 in accordance with another embodiment of the present invention. In step S21, each capacitor bank 32 under test is connected, either sequentially or simultaneously, to a low-value current source. In step S22, the current source provides each capacitor bank 32 with a current substantially equivalent to the allowable gate leakage of the capacitor bank 32. In the presence of the low-value current source, a capacitor bank 32 with a gate leakage less than the current provided by the current source will charge, while a capacitor bank 32 with a gate leakage higher than the current provided by the current source will either hold its voltage or drop to the lower rail voltage of the semiconductor device. In step S23, the voltage on each capacitor bank 32 is measured after a predetermined period of time. In step S24, the measured voltages are used to distinguish defective capacitor banks 32 from non-defective capacitor banks 32. A processing unit can be used to map defective and non-defective capacitor banks 32 and configure the PLL loop filter 34 to the required capacitance using, for example, the replacement process described above.

Figure 11:
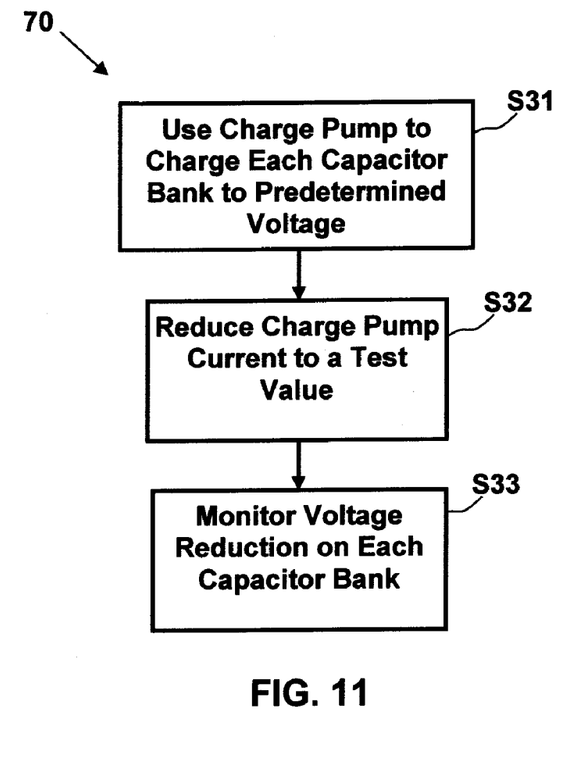

A flow diagram 70 illustrating a process for detecting defective capacitor banks 32 in accordance with another embodiment of the present invention is depicted in FIG. 11. In step S31, a charge pump or the like is used to charge each capacitor bank 32 under test to a predetermined voltage. In step S32, the charge pump current is reduced to a test value. In step S33, each capacitor bank 32 is monitored for reductions in voltage indicative of gate leakage above the charge pump test value (i.e., indicative of a defective capacitor bank 32).

Figure 12:
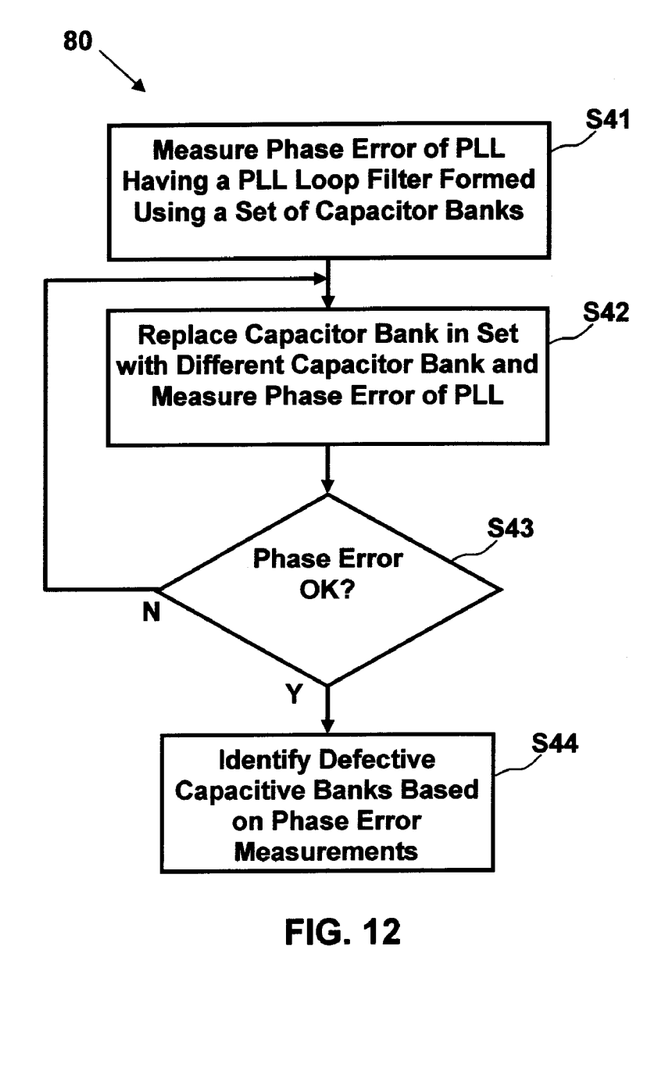

A flow diagram 80 illustrating a process for detecting defective capacitor banks 32 in accordance with a further embodiment of the present invention is depicted in FIG. 12. In step S41, the phase error of a PLL having a PLL loop filter formed using a set (i.e., one or more) of capacitor banks 32 is measured. In step S42, at least one capacitor bank 32 in the set is replaced by a different capacitor bank 32 and the phase error of the PLL is again measured. The swapping in and out of capacitor banks 32 is repeated (step S43) until the measured phase error is within specification or minimized. Based on the phase error measurements, defective capacitor banks 32 can be identified in step S44. A processing unit can be used track the various PLL loop filter configurations to aid in the identification of defective capacitor banks 32.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A circuit, comprising:
 a set of capacitor banks coupled in parallel to form a capacitor circuit;
 a detection system for identifying and isolating defective capacitor banks in the capacitor circuit;
 a set of redundant capacitor banks;
 a replacement system for replacing each defective capacitor bank in the capacitor circuit with a redundant capacitor bank from the set of redundant capacitor banks; and
 a switching system for selectively configuring at least one unused redundant capacitor bank in the set of redundant capacitor banks to provide decoupling capacitance.

2. The circuit of claim 1, wherein the capacitor circuit comprises a loop filter for a phase-locked-loop.

3. The circuit of claim 1, wherein the detection system further comprises:
 a testing system for testing each capacitor bank in the capacitor circuit to identify defective capacitor banks.

4. The circuit of claim 3, wherein the testing system further comprises:
 a switching system for selectively and independently connecting each capacitor bank in the capacitor circuit to a plurality of different voltages.

5. The circuit of claim 3, wherein the testing system further comprises:
 a compare circuit for comparing a voltage on each capacitor bank in the capacitor circuit to a predetermined minimum voltage to identify defective capacitor banks.

6. The circuit of claim 1, wherein the detection system further comprises:
 a switching system for permanently isolating each defective capacitor bank from the capacitor circuit.

7. An integrated circuit, comprising:
 a loop filter for a phase-locked-loop, wherein the loop filter includes:
  a set of capacitor banks coupled in parallel to form the loop filter; and
  a detection system for identifying and isolating defective capacitor banks
 in the set of capacitor banks;
 a set of redundant capacitor banks;
 a replacement system for replacing each defective capacitor bank in the set of capacitor banks with a redundant capacitor bank from the set of redundant capacitor banks; and
 a switching system for selectively configuring at least one unused redundant capacitor bank in the set of redundant capacitor banks to provide decoupling capacitance.

8. The integrated circuit of claim 7, wherein the detection system further comprises:
 a testing system for testing each capacitor bank in the set of capacitor banks to identify defective capacitor banks.

9. The integrated circuit of claim 8, wherein the testing system further comprises:
 a switching system for selectively and independently connecting each capacitor bank in the set of capacitor banks to a plurality of different voltages.

10. The integrated circuit of claim 8, wherein the testing system further comprises:

a compare circuit for comparing a voltage on each capacitor bank in the set of capacitor banks to a predetermined minimum voltage to identify defective capacitor banks.

11. The integrated circuit of claim 7, wherein the detection system further comprises:

a switching system for permanently isolating each defective capacitor bank from the loop filter.

12. A method for providing a loop filter for a phase-locked-loop, comprising:

forming the loop filter using a set of capacitor banks coupled in parallel;

detecting any defective capacitor banks in the set of capacitor banks;

isolating each defective capacitor bank;

providing a set of redundant capacitor banks;

replacing each defective capacitor bank with a redundant capacitor bank from the set of redundant capacitor banks; and selectively configuring at least one unused redundant capacitor bank in the set of redundant capacitor banks to provide decoupling capacitance.

13. The method of claim 12, wherein the step of detecting defective capacitor banks in the loop filter further comprises:

testing each capacitor bank in the set of capacitor banks to identify defective capacitor banks.

14. The method of claim 13, wherein the testing step further comprises:

selectively and independently connecting each capacitor bank in the set of capacitor banks to a plurality of different voltages.

15. The method of claim 12, wherein the detection step further comprises:

permanently isolating each defective capacitor bank from the loop filter.

* * * * *